United States Patent
Biberger et al.

(10) Patent No.: US 9,251,997 B2
(45) Date of Patent: Feb. 2, 2016

(54) METHOD FOR PROCESSING AND/OR FOR OBSERVING AN OBJECT, AND PARTICLE BEAM DEVICE FOR CARRYING OUT THE METHOD

(71) Applicant: Carl Zeiss Microscopy GmbH, Jena (DE)

(72) Inventors: Josef Biberger, Wildenberg (DE); Ralph Pulwey, Aalen (DE); Katja Tsyrulin, Aalen (DE); Roland Salzer, Leipzig (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/462,808

(22) Filed: Aug. 19, 2014

(65) Prior Publication Data

US 2015/0048248 A1 Feb. 19, 2015

(30) Foreign Application Priority Data

Aug. 19, 2013 (DE) .......................... 10 2013 216 418
Aug. 23, 2013 (DE) .......................... 10 2013 216 857

(51) Int. Cl.
*B82Y 10/00* (2011.01)
*H01J 37/302* (2006.01)
(Continued)

(52) U.S. Cl.
CPC ............... *H01J 37/302* (2013.01); *H01J 37/28* (2013.01); *H01J 37/304* (2013.01); *H01J 37/3056* (2013.01); *H01J 2237/30488* (2013.01);
(Continued)

(58) Field of Classification Search
USPC .............. 250/307, 311, 396 ML, 396 R, 398, 250/492.2, 492.3, 309, 491.1
See application file for complete search history.

(56) References Cited

U.S. PATENT DOCUMENTS

| 4,445,039 A | 4/1984 | Yew |
| 5,825,039 A | 10/1998 | Hartley |

(Continued)

FOREIGN PATENT DOCUMENTS

| DE | 103 51 276 A1 | 6/2005 |
| EP | 1 191 399 A2 | 3/2002 |

OTHER PUBLICATIONS

T. Löwer, "Neue Entwicklungen In Der Elektronenstrahltechnik Und Ihre Anwendungen," ("New Developments in Electron Beam Technology and Their Applications") in: Innovationsforum Elektronenstrabitechnologie IM Maschinen—Und Apparatebau, Germany, Mar. 7-8, 2007, <<www.innovationsforum-elektronenstrahl.de/download/vortraege/Loewer.pdf>>.

*Primary Examiner* — Phillip A Johnston
*Assistant Examiner* — Hsien Tsai
(74) *Attorney, Agent, or Firm* — Muirhead and Saturnelli, LLC (57) ABSTRACT

A method is provided for processing and/or observing an object using at least one particle beam that is scanned over the object. A scan region on the object is determined, the scan region having scan lines, and the particle beam is moved in a first scanning direction along one of the scan lines. The first scanning direction is changed to a second scanning direction at a change-of-direction time. Changing from the first scanning direction to the second scanning direction comprises setting of a point of rotation in that scan line of the scan region in which the particle beam is situated at the change-of-direction time, with an axis of rotation extending through the point of rotation. The first scanning direction is changed into the second scanning direction by rotating the scan region about the axis of rotation, with the point of rotation being selected dependent on the direction of rotation.

26 Claims, 6 Drawing Sheets

(51) Int. Cl.
*H01J 37/28* (2006.01)
*H01J 37/305* (2006.01)
*H01J 37/304* (2006.01)

(52) U.S. Cl.
CPC .................. *H01J2237/31745* (2013.01); *H01J 2237/31749* (2013.01)

(56) References Cited

U.S. PATENT DOCUMENTS

| | | | |
|---|---|---|---|
| 6,570,155 B1 | 5/2003 | Prior et al. | |
| 8,134,124 B2 | 3/2012 | Blackwood et al. | |
| 8,350,237 B2 | 1/2013 | Tanner | |
| 8,916,839 B2 | 12/2014 | Suzuki | |
| 2005/0116165 A1* | 6/2005 | Kienle | G01N 23/2204 250/311 |
| 2008/0032066 A1* | 2/2008 | Stiblert et al. | 427/595 |
| 2008/0135779 A1* | 6/2008 | Shichi | H01J 27/10 250/440.11 |
| 2012/0322248 A1* | 12/2012 | Ninomiya | H01J 37/3171 438/514 |

\* cited by examiner

METHOD FOR PROCESSING AND/OR FOR OBSERVING AN OBJECT, AND PARTICLE BEAM DEVICE FOR CARRYING OUT THE METHOD

TECHNICAL FIELD

This application relates to a method for processing and/or for observing an object, and to a particle beam device for carrying out the method.

BACKGROUND OF THE INVENTION

Particle beam devices have already been used for a long time for obtaining knowledge in respect of the properties and the behavior of objects (also referred to as samples below) under certain conditions. An electron beam device, in particular a scanning electron microscope (also referred to as SEM below) or a transmission electron microscope (also referred to as TEM below), is one of these particle beam devices.

In the case of an SEM, an electron beam (also referred to as primary electron beam below) is generated using a beam generator and focused on a sample to be examined by a beam guidance system, in particular by an objective lens. Using a deflection apparatus, the primary electron beam is guided over a surface of the sample to be examined in a raster-like manner. Here, the primary electron beam electrons interact with the material of the sample to be examined. Interaction particles, in particular, are generated as a result of the interaction. By way of example, electrons (so-called secondary electrons) are emitted from the surface of the sample to be examined and primary electron beam electrons (so-called backscattered electrons) are scattered back. The secondary electrons and the backscattered electrons are detected and used for generating an image. Thus, an image of the surface of the sample to be examined is obtained.

Furthermore, the prior art has disclosed the practice of using combination devices for examining and/or processing samples, in which both electrons and ions may be guided onto a sample to be examined and/or to be processed. By way of example, the practice of additionally equipping an SEM with an ion beam column is known. Ions which are used for processing a sample (e.g. ablating a surface of the sample or applying material to the sample) or else for imaging are generated using an ion generator arranged in the ion beam column. In this case, the SEM serves, in particular, for observing the processing (i.e. a preparation of the sample), but also for the further examination of the unprepared and/or prepared sample.

By way of example, using the aforementioned combination device, it is possible to produce, in the form of a TEM lamella, a sample to be examined (i.e. to be analyzed). The TEM lamella comprises a region which can be examined in more detail using a TEM. By way of example, this region is referred to as a target region. By way of example, in order to produce the TEM lamella, the ion beam is used to ablate regions of the sample arranged around the target region such that the TEM lamella, which then comprises the target region, is exposed.

In the TEM, a primary electron beam, which extends along an optical axis of the TEM, passes through the target region of the TEM lamella. By way of example, electrons of the primary electron beam transmitted (i.e. passed) through the target region of the TEM lamella are detected using a detector. The detector provides detection signals which are evaluated and used for the analysis of the target region.

In order to be able to obtain good transmission of the primary electron beam electrons through the target region, it is desirable for the TEM lamella, at least in the target region, to have a substantially identical extent—to be precise, as seen in the beam direction of the primary electron beam and/or in the direction of the optical axis of the TEM. This promotes sufficiently good transmission of the primary electron beam electrons through the target region. Expressed differently, the TEM lamella should, at least in the target region, have an embodiment with a uniform thickness in the beam direction of the primary electron beam and/or in the direction of the optical axis of the TEM.

In order, firstly, to obtain a uniform extent of the TEM lamella in the beam direction of the primary electron beam (or in the direction of the optical axis of the TEM) and, secondly, to embody the TEM lamella in such a way that the TEM lamella sufficiently encompasses the target region, the prior art has disclosed a method by which the TEM lamella can be produced in an aforementioned combination device. This will now be explained in more detail with reference to FIG. 1. Initially, the SEM is used to identify a target region ZB, to be examined, on a surface of a sample O to be examined. Now, a scan region RB on the surface of the sample O is selected at a selectable distance from the target region ZB, for example at a distance of a few micrometers. The scan region RB is composed of a multiplicity of scan lines which, for example, are arranged parallel to one another. Each scan line comprises a multiplicity of scanning points P. In an exemplary manner, FIG. 1 shows three scan lines of the scan region RB, namely a first scan line RZ1, a second scan line RZ2 and a third scan line RZ3.

The scan region RB is now processed using the ion beam. This is observed using the SEM. In the exemplary embodiment depicted in FIG. 1, the scan region RB is exposed using the ion beam. In other words, the material of the sample O encompassed by the scan region RB is ablated. Ablating material is also known by the specialist term "milling". The material is ablated in such a way that the ion beam is firstly guided along the arrow direction PA to each individual scan line RZ1 to RZ3 and is secondly guided in succession along the arrow direction PB to each scanning point P along each scan line RZ1 to RZ3. The scan region RB approaches the target region ZB as a result of the continued movement of the ion beam in the arrow direction PA and the ablation of the material as explained above. Therefore, it is possible to expose a TEM lamella made of the material of the sample O by ablating material around the target region ZB, e.g. to release the TEM lamella from the sample O and e.g. to examine it in more detail in a TEM.

Figure 1:
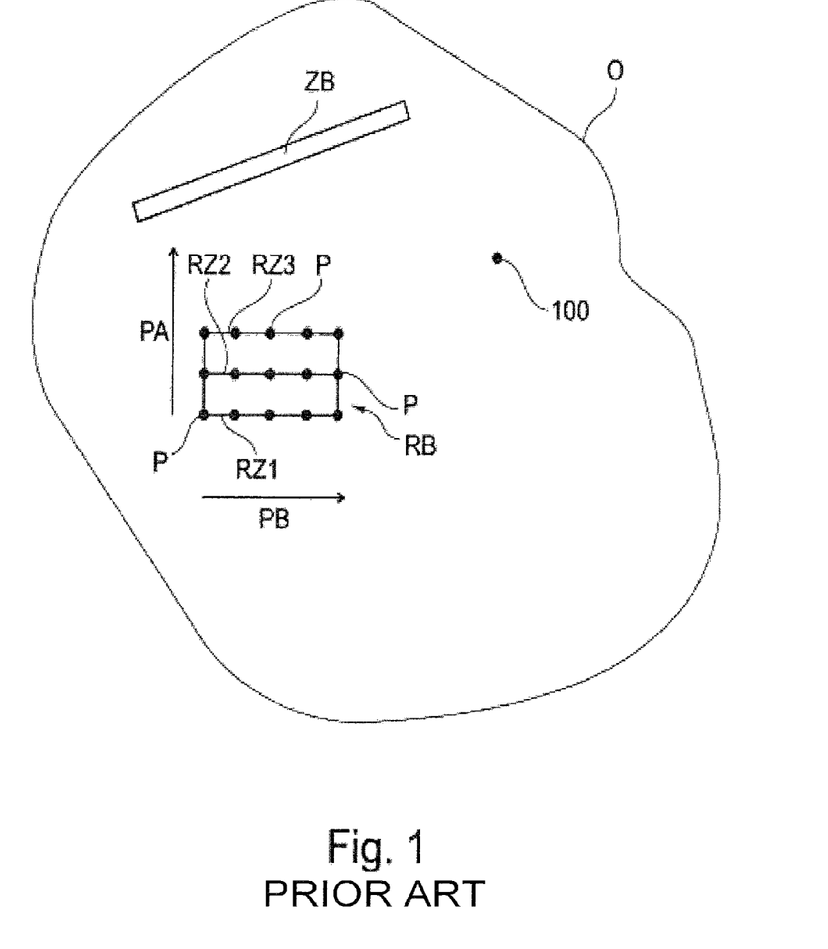
FIG. 1 shows a schematic illustration for explaining a method for rotating a scan region according to the prior art.

From observing FIG. 1, it becomes clear that the scan region RB would not be aligned parallel to the target region ZB in the case of continued movement in the arrow direction PA. However, said parallel alignment is desired so as to obtain an extent of the TEM lamella, at least in the target region ZB, which is as uniform as possible. In order to align the scan region RB parallel to the target region ZB, the practice of rotating the scan region RB about an axis 100 has been disclosed. The axis 100 is fixedly predetermined and passes through a point on the surface of the sample O. The axis 100 corresponds to the optical axis of the ion beam column in the combination device. The scan region RB is then rotated about the axis 100 by a so-called scan rotation of the ion beam. Here, a scanning direction is rotated by virtue of two deflection elements of the ion beam column, which are provided for deflecting the ion beam, being actuated in a targeted manner. Thus, provision is made for a first deflection element for deflecting the ion beam in an X-direction to be, in addition to a control voltage for the X-direction, actuated by a component of the control voltage for a Y-direction. Furthermore, a second deflection element for deflecting the ion beam in a Y-direction is, in addition to a control voltage for the Y-direction, actuated by a component of the control voltage for the X-direction. Here, the components of the control voltages on the respective deflection system are usually determined taking into account the angle of rotation $\alpha$ according to the sine/cosine method. Here, the control voltage for the first deflection system $V_1$ is calculated from the control voltage for the X-direction Vx and from the control voltage for the Y-direction Vy according to $V_1 = Vx \cos \alpha - Vy \sin \alpha$. The control voltage for the second deflection system $V_2$ is calculated from the control voltage for the Y-direction Vy and from the control voltage for the X-direction Vx according to $V_2 = Vx \sin \alpha + Vy \cos \alpha$. If the scan region RB is at a distance from the axis 100 (cf. FIG. 1), the scan region RB of the ion beam moves away from its original position when carrying out the scan rotation and possibly also wanders out of the observation region of the SEM. Therefore, the ion beam is initially guided back toward the scan region RB again. This is obtained using a so-called "beam shift", in which the ion beam is guided back to the original scan region RB again by translational movements.

This known method is complicated due to the two possible adjustment stages, namely, firstly, the scan rotation and, secondly, the beam shift. It is therefore desirable to specify a method by which, in particular, a parallel approach of the scan region RB to the target region ZB is possible in a simple manner and by which the TEM lamella can be embodied with uniform thickness, particularly in the target region ZB.

In respect of the further prior art, reference is made to U.S. Pat. No. 8,350,237 B2, which is incorporated herein by reference, in which a method for automated ablation of material of an object is described.

Accordingly, it would be desirable to specify a method for processing and/or observing an object, which method enables, in a simple manner, the generation of uniformly thick objects and the rotation of a scan region over the surface of the object in a simple manner.

SUMMARY OF THE INVENTION

According to the system described herein, provision is made for a method for processing and/or observing an object using at least one particle beam with charged particles, in which method the particle beam is scanned over the object. The method according to the system described herein comprises the step of determining a scan region on the object, wherein the scan region has a multiplicity of scan lines. By way of example, the scan lines are arranged parallel to one another and are e.g. in each case embodied as a straight line. However, the system described herein is not restricted to a parallel arrangement of the scan lines. Rather, any arrangement of scan lines is provided in the system described herein. Moreover, the system described herein is not restricted to the use of a multiplicity of scan lines. Rather, the scan region may also comprise only a single scan line. The shape of the scan line(s) can also be selected in any suitable manner. By way of example, the scan line or the scan lines have a spiral-shaped embodiment.

In the method according to the system described herein, the particle beam is moved along one of the multiplicity of scan lines in a first scanning direction. At a change-of-direction time, the first scanning direction is changed into a second scanning direction. Expressed differently, the particle beam changes the scanning direction at a certain time, namely the change-of-direction time. Changing the first scanning direction into the second scanning direction comprises a setting of a point of rotation in that scan line of the scan region in which the particle beam is situated at the change-of-direction time, with an axis of rotation extending through the point of rotation. By rotating the scan region about the axis of rotation, the first scanning direction is changed into the second scanning direction, with the location of the point of rotation (i.e. the position of the point of rotation) being selected dependent on the direction of rotation.

In principle, the first scanning direction is a first vector characterized by a first direction, with the first direction corresponding to the first scanning direction. Before the rotation, the first scanning direction is arranged perpendicular or substantially perpendicular to each scan line of the multiplicity of scan lines.

In principle, the second scanning direction is a second vector characterized by a second direction, with the second direction corresponding to the second scanning direction. After the rotation of the scan region, the second scanning direction is arranged perpendicular or substantially perpendicular to each scan line of the multiplicity of scan lines.

Accordingly, in contrast to the known prior art, the point of rotation on the surface of the object and hence the axis of rotation are not fixedly predetermined, but rather they are selected in a suitable manner at the change-of-direction time. Here, the point of rotation and the axis of rotation are selected dependent on the direction of rotation. By way of example, provision is made for the scan line in which the point of rotation is situated not to be displaced into a region of the object in the direction of the first scanning direction when the scan region is rotated. Rather, provision is made, for example, for this scan line to be displaced in a direction opposite to the first scanning direction after the rotation. This is made possible by a suitable selection of the point of rotation. Expressed differently, the point of rotation and the axis of rotation are selected in such a way that scanning points of the scan lines in the scan region are further away from a target region of the object after the rotation of the scan region than scanning points of the scan line which were scanned by the particle beam before the rotation of the scan region. Exemplary embodiments are mentioned further below.

By setting the point of rotation and the axis of rotation, the method according to the system described herein ensures that, in particular, a TEM lamella, in which a target region, to be examined and/or to be processed, of an object is arranged, can be produced in a simple and sufficiently good manner. In particular, it is possible, in a simple manner, to bring a scan region, in which material for producing the TEM lamella is ablated, to the target region in a manner which is as parallel as possible. Furthermore, what is ensured is that the TEM lamella has an extent in the target region in the direction of an analysis particle beam, e.g. of a primary electron beam in a TEM, that is as uniform as possible.

By way of example, the system described herein also provides for always selecting the location of the point of rotation in such a way that the scan region continues to be scanned after the rotation in such a way that there can be no damage of the TEM lamella.

Reference is made to the fact that the method according to the system described herein is not restricted to the production of a TEM lamella. Rather, the method according to the system described herein is suitable for processing and/or for observing and/or for analyzing any object. In particular, the method according to the system described herein is also suitable for preparing cross sections of an object.

In an embodiment of the method according to the system described herein, provision is additionally or alternatively made for the point of rotation to be set in such a way that the axis of rotation is oriented perpendicular to a surface of the object. In further embodiments, provision is made for the axis of rotation to include an angle different from 0° or 180° with the surface of the object.

In an in turn further embodiment of the method according to the system described herein, provision is additionally or alternatively made for each scan line of the multiplicity of scan lines to respectively comprise a first scan line end and to respectively comprise a second scan line end. In this exemplary embodiment, the first scan line end or the second scan line end of the scan line, at which the particle beam is situated at the change-of-direction time, is set as point of rotation. In a further embodiment of the method according to the system described herein, provision is additionally or alternatively made for the first scan line end to be set as the point of rotation in the case of a clockwise rotation. Provision is made for the first scan line end to be set at a left-hand edge of the scan line as point of rotation in the case of a clockwise rotation (i.e. a right-hand rotation). As an alternative to this, provision is made for the second scan line end to be set as the point of rotation in the case of a counterclockwise rotation. Furthermore, provision is made for the second scan line end to be set at a right-hand edge of the scan line as point of rotation in the case of a counterclockwise rotation (i.e. a left-hand rotation). In particular, the aforementioned embodiments of the method according to the system described herein ensure that the scan line in which the point of rotation is situated is not displaced into a region of the object in the direction of the first scanning direction in the case of the rotation of the scan region. As a result of the rotation, the scan line is displaced in a direction opposite to the first scanning direction.

A further embodiment of the method according to the system described herein is based on the concept of input signals representing groups or portions of scanning points of the scan region being fed to a scan generator, with the aid of which the particle beam is guided along the scan lines. The particle beam is then guided along the group or portion of scanning points given by coordinates. Only once the particle beam has been guided to the coordinates of a first group or a first portion are further input signals, which represent a second group or a second portion with further coordinates of scanning points, made available to the scan generator. The particle beam is also only guided to the coordinates of the scanning points of the second group at this time. By way of example, if it is now determined during the production of a TEM lamella that a change in direction of the scan region is necessary, the point of rotation and the axis of rotation are, in an exemplary embodiment of the method according to the system described herein, selected dependent not only on the direction of rotation but also dependent on the progress of the scanning by the particle beam in the scan region. In an exemplary embodiment of the method according to the system described herein, provision is made for e.g. the first scanning point of the first group to be set as point of rotation in the case of a rotation of the scan region in the clockwise direction after the particle beam was guided to scanning points of the second group. If there is to be a rotation in the counterclockwise direction, e.g. the last scanning point of the second group is set as point of rotation.

In an embodiment of the method according to the system described herein, provision is additionally or alternatively made for the particle beam to be moved in such a way that the particle beam does not cross that scan line in which the particle beam is situated at the change-of-direction time after the rotation of the scan region from the first scanning direction to the second scanning direction. Expressed differently, the movement of the particle beam after the rotation of the scan region from the first scanning direction to the second scanning direction is continued in such a way that the scan line in which the point of rotation is situated, which was already passed through by the scan region before the rotation of the scan region, is not passed through again by the particle beam, but rather the particle beam is substantially moved over a new scan line. By way of example, the new scan line is at a distance from the scan line in which the point of rotation is situated. Expressed differently, the new scan line after the rotation of the scan region is e.g. arranged in such a way that the new scan line after the rotation is at the distance from the scan line prior to the rotation. As an alternative to this, provision is made for the new scan line to contact, but not cross, the scan line in which the point of rotation is situated.

In a further exemplary embodiment of the method according to the system described herein, provision is additionally or alternatively made for the method according to the system described herein furthermore to comprise the step of setting the speed at which the particle beam is moved over the scan region. Additionally or alternatively, provision is made for setting how often the particle beam is guided along one of the scan lines. By way of example, provision is made for the particle beam to be guided a number of times over one of the scan lines.

By way of example, the method according to the system described herein can be used in a combination device, which provides a first particle beam with charged first particles and a second particle beam with charged second particles. In an exemplary embodiment of the method according to the system described herein, provision is then additionally or alternatively made for the particle beam to be embodied as the first particle beam, with which the scan region is processed. Furthermore, provision is made for the object to be observed using the second particle beam. In particular, provision is made for an ion beam to be used as first particle beam and for an electron beam to be used as second particle beam. As an alternative to this, provision is made for an ion beam to be used as second particle beam.

The system described herein also relates to a computer program product comprising program code, which can be loaded into a processor (or which is loaded into a processor) and which, when executed, controls a particle beam device in such a way that it carries out a method which comprises at least one of the aforementioned features or features mentioned below, or a combination of at least two of the aforementioned features or features specified in the following text.

The system described herein furthermore relates to a particle beam device comprising at least one beam generator for generating a particle beam with charged particles, comprising at least one objective lens for focusing the particle beam onto an object, and comprising a control unit comprising at least one processor into which an aforementioned computer program product is loaded.

In a further embodiment of the particle beam device according to the system described herein, the beam generator is embodied as a first beam generator for generating a first particle beam with charged first particles and the objective lens is embodied as a first objective lens. Moreover, this embodiment of the particle beam device according to the system described herein comprises at least one second beam generator for generating a second particle beam with charged second particles and a second objective lens for focusing the second particle beam onto the object. By way of example, the first particle beam is embodied as an ion beam. By way of example, the second particle beam is embodied as an electron beam or an ion beam.

BRIEF DESCRIPTION OF THE DRAWINGS

Embodiments of the system described herein are explained with reference to the several figures of the drawings, which are briefly described as follows.

DETAILED DESCRIPTION OF VARIOUS EMBODIMENTS

Figure 2:
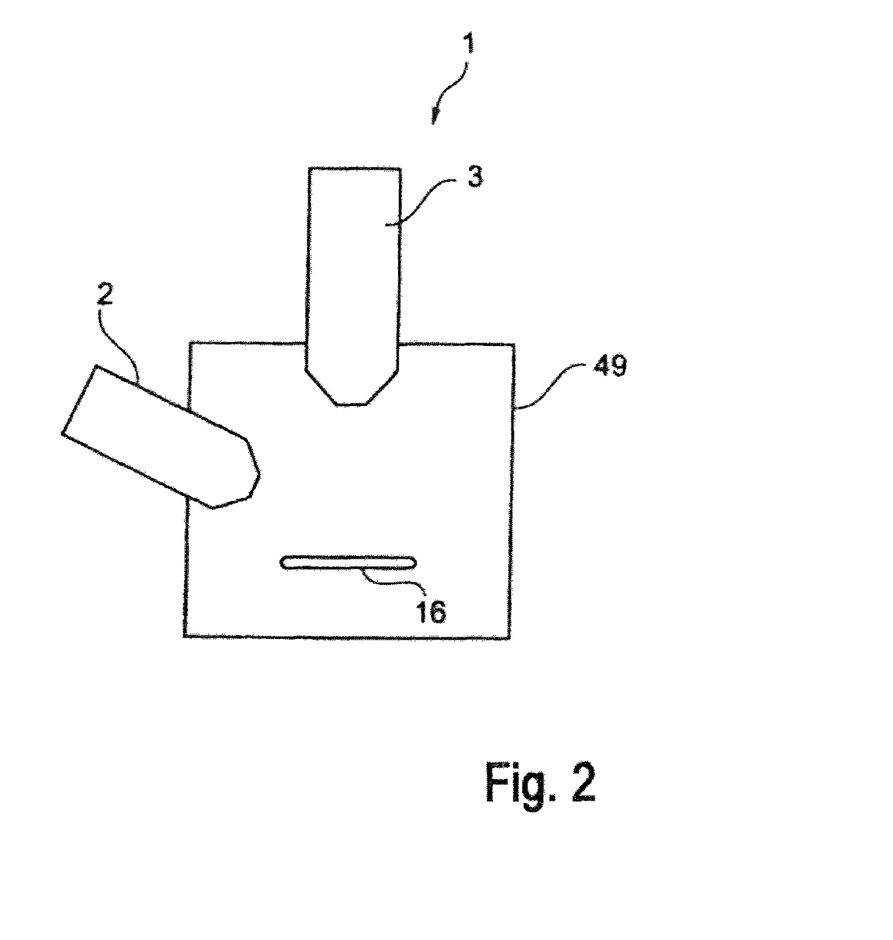
FIG. 2 shows a schematic illustration of a particle beam device with two particle beam columns according to an embodiment of the system described herein.

FIG. 2 shows an embodiment of a particle beam device 1 according to the system described herein in a schematic illustration. The particle beam device 1 comprises a first particle beam column 2 in the form of an ion beam column and a second particle beam column 3 in the form of an electron beam column. The first particle beam column 2 and the second particle beam column 3 are arranged on a sample chamber 49, in which a sample 16 to be examined is arranged.

Reference is explicitly made to the fact that the system described herein is not restricted to the first particle beam column 2 being embodied as an ion beam column and the second particle beam column 3 being embodied as an electron beam column. Rather, the system described herein also provides for it to be possible that the first particle beam column 2 is embodied as an electron beam column and the second particle beam column 3 is embodied as an ion beam column. A further embodiment of the system described herein provides for both the first particle beam column 2 and the second particle beam column 3 to be embodied in each case as an ion beam column.

Figure 3:
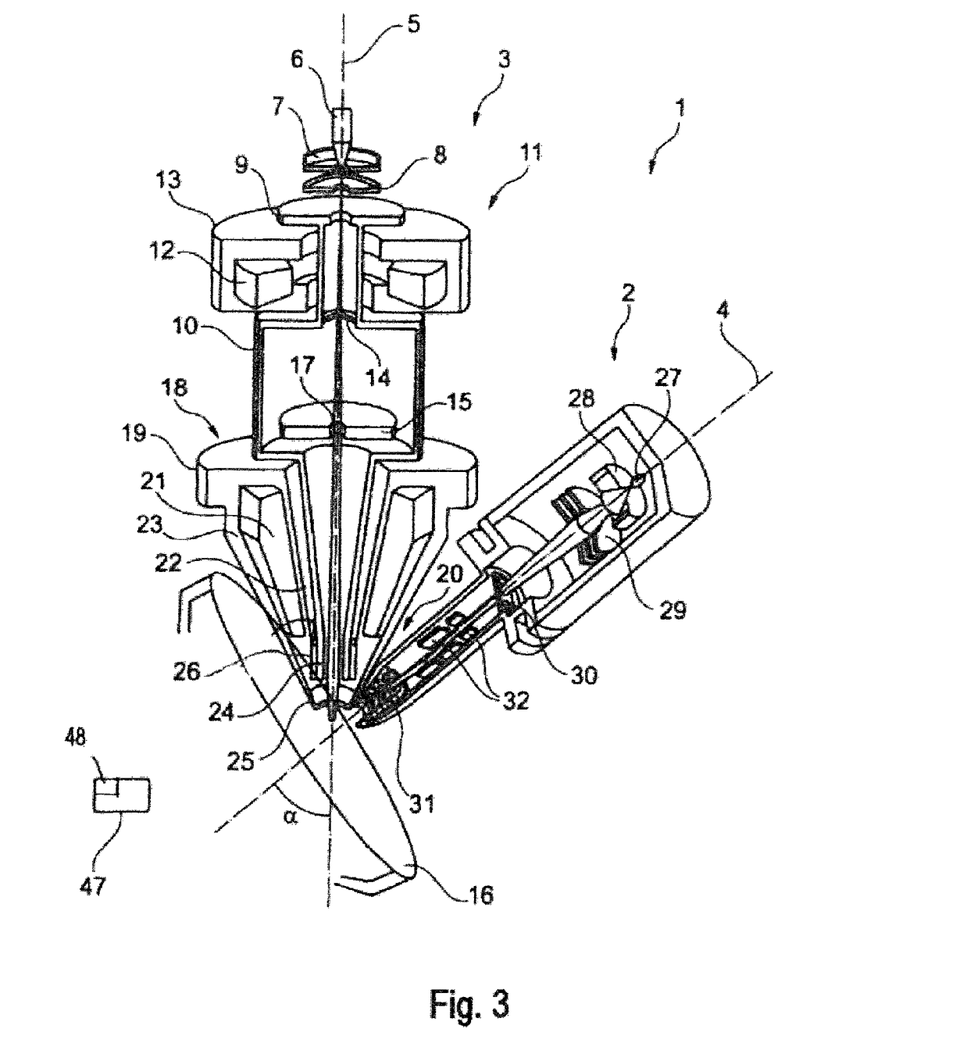
FIG. 3 shows a further illustration of the particle beam device according to FIG. 2.

FIG. 3 shows the particle beam device 1 from FIG. 2 in a detailed illustration. The sample chamber 49 is not depicted for reasons of clarity. The first particle beam column 2 in the form of the ion beam column has a first optical axis 4. Furthermore, the second particle beam column in the form of the electron beam column has a second optical axis 5. The first particle beam column 2 is arranged tilted at an angle with respect to the second particle beam column 3. By way of example, the angle may lie in a range from 50° to 90°. However, the system described herein is not restricted to an angle in the aforementioned range. Rather, any suitable value may be selected for the angle.

In the following text, the second particle beam column 3 in the form of the electron beam column is initially discussed in detail. The second particle beam column 3 comprises a second beam generator 6, a first electrode 7, a second electrode 8 and a third electrode 9. By way of example, the second beam generator 6 is a thermal field emitter. The function of the first electrode 7 is that of a suppressor electrode, while the function of the second electrode 8 is that of an extractor electrode. The third electrode 9 is embodied as an anode and, at the same time, forms one end of a beam guidance tube 10. A second particle beam in the form of an electron beam is generated using the second beam generator 6. Electrons emerging from the second beam generator 6 are accelerated to the anode potential, for example in the region from 1 kV to 30 kV, due to a potential difference between the second beam generator 6 and the third electrode 9. The second particle beam in the form of the electron beam passes through the beam guidance tube 10 and is focused on the sample 16 to be examined. This is explained in more detail further below.

The beam guidance tube 10 passes through a collimator arrangement 11, which comprises a first ring coil 12 and a yoke 13. As seen in the direction of the sample 16 from the second beam generator 6, a pinhole aperture 14 and a detector with a central opening 17 are arranged in the beam guidance tube 10 along the second optical axis 5, following the collimator arrangement 11. Then, the beam guidance tube 10 extends through a bore of a second objective lens 18. The second objective lens 18 serves to focus the second particle beam on the sample 16. To this end, the second objective lens 18 comprises a magnetic lens 19 and an electrostatic lens 20. The magnetic lens 19 is provided with a second ring coil 21, an inner pole piece 22 and an outer pole piece 23. The electrostatic lens 20 comprises one end 24 of the beam guidance tube 10 and a termination electrode 25. The end 24 of the beam guidance tube 10 and the termination electrode 25 form an electrostatic retardation apparatus. The end 24 of the beam guidance tube 10, together with the beam guidance tube 10, lies at the anode potential, while the termination electrode 25 and the sample 16 lie at a potential which is lower than the anode potential. This allows the electrons in the second particle beam to be decelerated to a desired energy required for examining or imaging the sample 16. The second particle beam column 3 moreover comprises a scanning apparatus 26, by which the second particle beam can be deflected and scanned over the sample 16. The scanning apparatus 26 is connected to a control unit 47. The control unit 47 provides control signals for the scanning apparatus 26 in such a way that the second particle beam is scanned in a certain way over a surface of the sample 16.

For imaging purposes, secondary electrons and/or backscattered electrons which are generated by the interaction of the second particle beam with the sample 16 are detected using the detector 15 arranged in the beam guidance tube 10. The signals generated by the detector 15 are transmitted to an electronics unit (not depicted here) for imaging purposes.

The sample 16 is arranged on a sample stage (not depicted here), by which the sample 16 is movably arranged along three axes (namely an x-axis, a y-axis and a z-axis) arranged perpendicular to one another. Moreover, the sample stage can be rotated about two axes of rotations arranged perpendicular to one another. Hence, it is possible to bring the sample 16 into a desired position.

As already mentioned above, the reference sign 2 denotes the first particle beam column in the form of the ion beam column. The first particle beam column 2 comprises a first beam generator 27 in the form of an ion source. The first beam generator 27 serves for generating a first particle beam in the form of an ion beam. Furthermore, the first particle beam column 2 is provided with an extraction electrode 28 and a collimator 29. Along the first optical axis 4, a variable stop 30 is arranged downstream of the collimator 29 in the direction of the sample 16. The first particle beam is focused on the sample 16 using a first objective lens 31 in the form of focusing lens elements. Scanning electrodes 32 are provided for scanning the first particle beam over the sample 16. The scanning electrodes 32 are connected to the control unit 47. The control unit 47 provides control signals to the scanning electrodes 32 in such a way that the first particle beam is scanned over the surface of the sample 16 in a specific way.

The first particle beam interacts with the material from the sample 16 when the first particle beam is incident on the sample 16. By way of example, the material of the sample 16 is ablated, as will still be explained in more detail below.

The control unit 47 comprises a processer 48. A computer program product which, when executed on the processor 48, controls the particle beam device 1 in such a way that it carries out method steps of the method according to the system described herein is loaded onto the processor 48. An exemplary embodiment of the method according to the system described herein will be explained using FIGS. 4 and 5.

Figure 4:
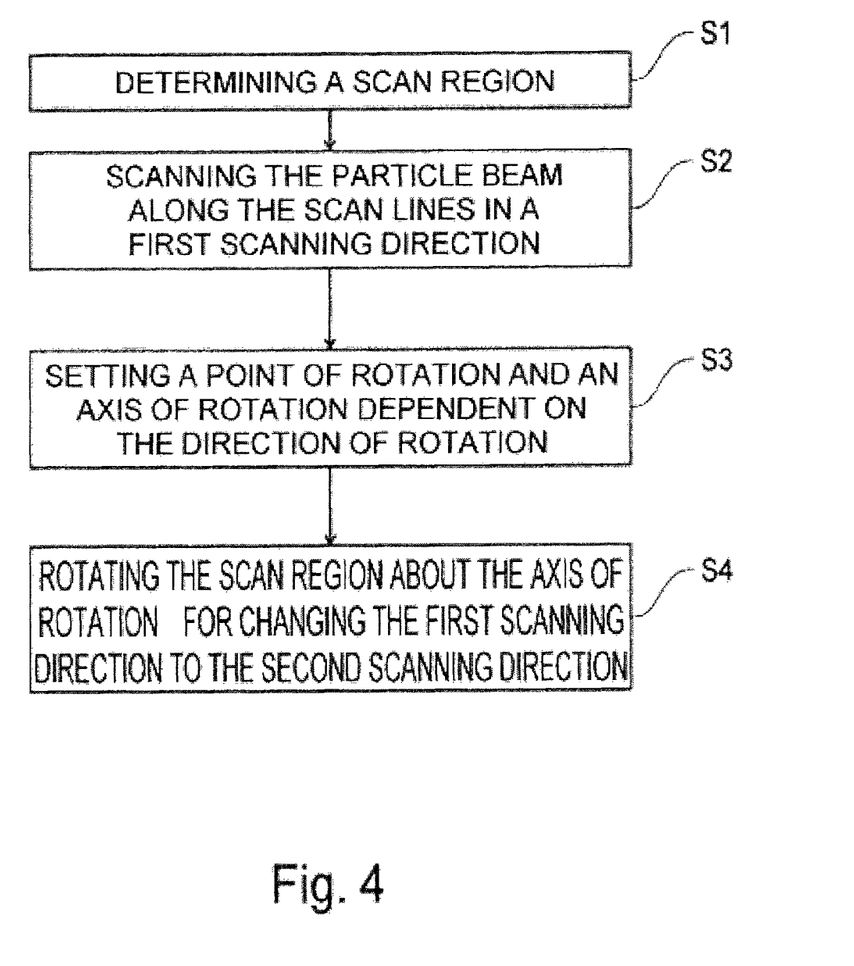
FIG. 4 shows a flowchart of method steps of an exemplary embodiment of a method according to the system described herein.

FIG. 4 shows the progress of an embodiment of the method in accordance with the system described herein. A user wishing to analyze a certain target region ZB of the sample 16 (cf. FIG. 5) using, for example, a TEM will separate a TEM lamella containing the target region ZB from the sample 16 using the particle beam device 1. Following the separation of the TEM lamella from the sample 16, the TEM lamella is loaded into the TEM and the target region ZB is examined in more detail using the TEM. In an alternative embodiment, provision is also made for the TEM lamella to be left in the particle beam device 1 and for the target region ZB to be examined using the particle beam device 1.

Figure 5:
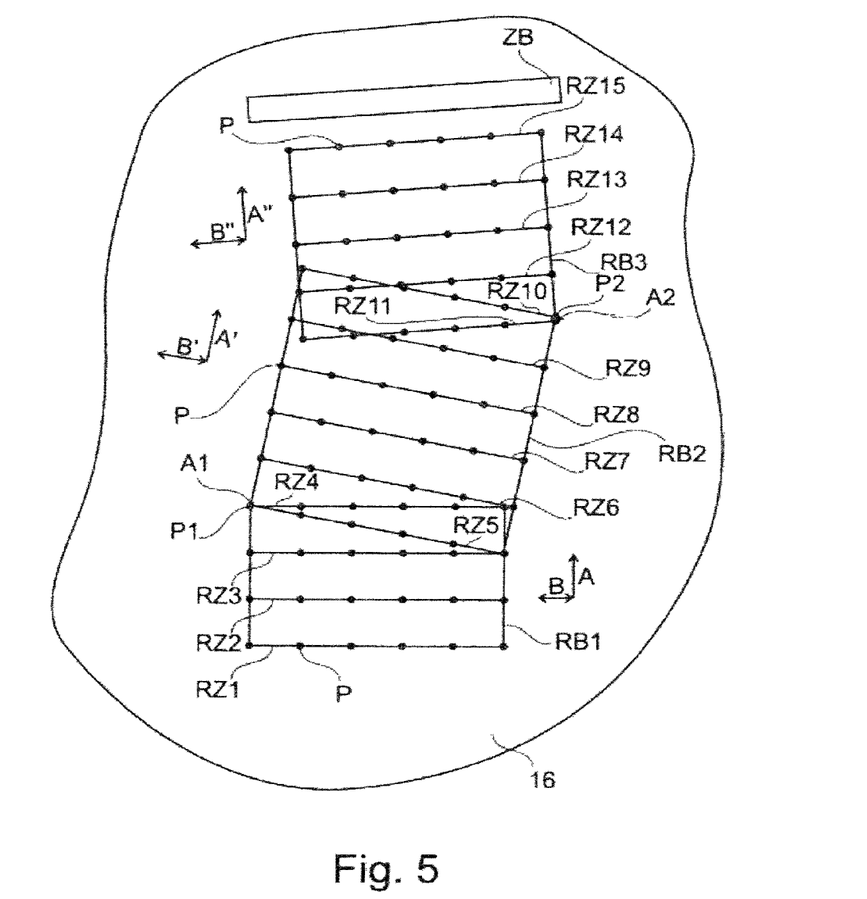
FIG. 5 shows a schematic illustration for explaining the method according to FIG. 4.

In order to produce the TEM lamella, a scan region is determined in a method step S1. In FIG. 5, this scan region is denoted by the reference sign RB1. The scan region RB1 is arranged at a distance of a few micrometers (for example up to 5 μm) from the target region ZB on the surface of the sample 16.

The scan region RB1 is composed of a multiplicity of scan lines which, in the exemplary embodiment depicted in FIG. 5, are, firstly, in each case embodied as a straight line and are, secondly, arranged parallel to one another. However, reference is explicitly made to the fact that the system described herein is not restricted to a parallel arrangement of the scan lines and the form of the scan lines depicted here. In this respect, reference is made to the remarks already made above.

As already mentioned above, the scan region RB1 comprises a multiplicity of scan lines. In FIG. 5, only 4 scan lines are depicted in an exemplary manner, namely a first scan line RZ1, a second scan line RZ2, a third scan line RZ3 and a fourth scan line RZ4. Each one of the aforementioned scan lines RZ1 to RZ4 comprises a multiplicity of scanning points P, wherein two scanning points P adjacent to one another have a distance from one another which, in general, is identical.

In a method step S2, the first particle beam is now scanned along the aforementioned scan lines RZ1 to RZ4. To this end, the first particle beam is guided, initially, to the scanning points P in the first scan line RZ1, then to the scanning points P in the second scan line RZ2, then to the scanning points P in the third scan line RZ3 and then to the scanning points P in the fourth scan line RZ4 using the control unit 47. To this end, the first particle beam is, firstly, guided in the first scanning direction A. This is the guidance of the first particle beam from one of the scan lines RZ1 to RZ4 to the next scan line RZ1 to RZ4. Secondly, the first particle beam is guided from scanning point P to scanning point P along the arrow directions B within each one of the aforementioned scan lines RZ1 to RZ4. In the process, material of the sample 16, which is arranged in the scan region RB1, is ablated using the first particle beam. This process is observed using the second particle beam. In this respect, reference is made to the text above.

If it is determined that the scan region RB1 would not be aligned parallel to the target region ZB in the case of continued movement of the first particle beam along the scan lines of the scan region RB1 in the first scanning direction A, then the scan region RB1 is rotated and the ablation of the material from the sample 16 is continued in a different direction. Therefore, the first scanning direction A is changed to a second scanning direction A' at a change-of-direction time $t_1$. To this end, provision is made for a point of rotation to be determined in a method step S3. The point of rotation is selected from the set of those scanning points P of the scan line at which the first particle beam is situated at the change-of-direction time $t_1$. In the exemplary embodiment depicted in FIG. 5, this is the scanning point P1 in the fourth scan line RZ4. A first axis of rotation A1, which is aligned substantially perpendicular to the surface of the sample 16, extends through the scanning point P1.

The scan region RB1 is now rotated in a method step S4. This is brought about by rotating the scan region RB1 about the first axis of rotation A1. In the exemplary embodiment depicted here, provision is made for the scan region RB1 to be rotated clockwise about the first axis of rotation A1. The rotation about the axis of rotation A1 takes place about an angle in such a way that the desired second scanning direction A' is set. By way of example, provision is made in the method according to the system described herein for setting the desired angle for the rotation using a setting process. By way of example, the setting process can provide an incremental increase or incremental decrease of the angle. By way of example, the angle is increased or decreased in steps of 0.5° or 1° until the desired angle and hence also the desired rotation about the first axis of rotation A1 are obtained in order to change the first scanning direction A to the second scanning direction A'. After changing the scanning direction, the scan region RB1 of the first particle beam is then continued in the second scanning direction A'. The continuation of the scan region RB1 is denoted by the reference sign RB2 in FIG. 5.

The process of the rotation is also observed using the second particle beam. As mentioned above, the second particle beam is the electron beam. However, in contrast to the prior art, in the system described herein, the scan regions RB1 and RB2 do not leave the observation region of the electron beam. In the method according to the system described herein, the image, generated by the second particle beam, of the surface of the sample 16 is neither rotated nor displaced. The second particle beam serves for generating the image of the surface of the sample 16 such that the changes brought about on the surface of the sample 16 using the first particle beam can be registered. The changes include, in particular, the ablation of material from, and the deposition of material on, the surface of the sample 16. Moreover, it is possible to observe the change in the scanning direction and hence also the setting of the angle for rotating the scan region. The aforementioned list is not exhaustive. Rather, any change on the surface of the sample 16, which is generated by the first particle beam or caused by the first particle beam, for example a change in direction or a rotation of the scan region, can be identified by the image generated by the second particle beam.

In the exemplary embodiment depicted in FIG. 5, the method steps S2 to S4 are now repeated, albeit now with reference to the continuation of the scan region RB1 in the form of the scan region RB2. The scan region RB2 likewise comprises a multiplicity of scan lines. In FIG. 5, only 6 scan lines are depicted in an exemplary manner, namely a fifth scan line RZ5, a sixth scan line RZ6, a seventh scan line RZ7, an eighth scan line RZ8, a ninth scan line RZ9 and a tenth scan line RZ10. Each of the aforementioned scan lines RZ5 to RZ10 has a multiplicity of scanning points P, wherein two scanning points P adjacent to one another have a distance from one another which, in general, is identical.

The first particle beam is now scanned along the aforementioned scan lines RZ5 to RZ10. To this end, the first particle beam is guided, initially, to the scanning points P in the fifth scan line RZ5, then to the scanning points P in the sixth scan line RZ6, then to the scanning points P in the seventh scan line RZ7, then to the scanning points P in the eighth scan line RZ8, then to the scanning points P in the ninth scan line RZ9 and then to the scanning points P in the tenth scan line RZ10 using the control unit 47. To this end, the first particle beam is, firstly, guided in the second scanning direction A'. In the process, the first particle beam is guided from one of the scan lines RZ5 to RZ10 to the next of the scan lines RZ5 to RZ10. Secondly, the first particle beam is guided from scanning point P to scanning point P along the arrow directions B' within each one of the aforementioned scan lines RZ5 to RZ10. In the process, material of the sample 16, which is arranged in the scan region RB2, is ablated using the first particle beam. This process is observed using the second particle beam. In this respect, reference is made to the text above.

If it is determined, once again, that the scan region RB2 would not be aligned parallel to the target region ZB in the case of continued movement of the first particle beam along the scan lines of the scan region RB2 in the second scanning direction A', then the scan region RB2 is rotated and the ablation of the material from the sample 16 is continued in a different direction.

Therefore, the second scanning direction A' is changed to a third scanning direction A" at a change-of-direction time $t_2$. To this end, provision is made for a further point of rotation to be set in the method step S3. The further point of rotation is selected from the set of those scanning points P of the scan line at which the first particle beam is situated at the change-of-direction time $t_2$. In the exemplary embodiment depicted in FIG. 5, this is the scanning point P2 in the tenth scan line RZ10. In the embodiment depicted in FIG. 5, the scanning point P2 represents one end of the tenth scan line RZ10. A second axis of rotation A2, which is aligned substantially perpendicular to the surface of the sample 16, extends through the scanning point P2. The scan region RB2 is now rotated in the method step S4. This is brought about by rotating the scan region RB2 about the second axis of rotation A2. In the exemplary embodiment depicted here, provision is made for the scan region RB2 to be rotated counterclockwise about the second axis of rotation A2. The rotation about the second axis of rotation A2 takes place about an angle in such a way that the desired third scanning direction A" is set. Provision is also made here for setting the desired angle for the rotation using a setting process. By way of example, the setting process can once again provide an incremental increase or incremental decrease of the angle. By way of example, the angle is increased or decreased in steps of 0.5° or 1° until the desired angle and hence also the desired rotation about the second axis of rotation A2 are obtained in order to change the second scanning direction A' to the third scanning direction A". After changing the scanning direction, the scan region RB2 of the first particle beam is then continued in the third scanning direction A". The continuation of the scan region RB2 is denoted by the reference sign RB3 in FIG. 5.

The scan region RB3 likewise comprises a multiplicity of scan lines. In FIG. 5, only 5 scan lines are depicted in an exemplary manner, namely an eleventh scan line RZ11, a twelfth scan line RZ12, a thirteenth scan line RZ13, a fourteenth scan line RZ14 and a fifteenth scan line RZ15. Each of the aforementioned scan lines RZ11 to RZ15 has a multiplicity of scanning points P, wherein two scanning points P adjacent to one another have a distance which, in general, is identical.

The first particle beam is now scanned along the aforementioned scan lines RZ11 to RZ15. To this end, the first particle beam is guided, initially, to the scanning points P in the eleventh scan line RZ11, then to the scanning points P in the twelfth scan line RZ12, then to the scanning points P in the thirteenth scan line RZ13, then to the scanning points P in the fourteenth scan line RZ14 and then to the scanning points P in the fifteenth scan line RZ15 using the control unit 47. To this end, the first particle beam is, firstly, guided in the third scanning direction A". In the process, the first particle beam is guided from one of the scan lines RZ11 to RZ15 to the next of the scan lines RZ11 to RZ15. Secondly, the first particle beam is guided from scanning point P to scanning point P along the arrow directions B" within each one of the aforementioned scan lines RZ11 to RZ15. In the process, material of the sample 16, which is arranged in the scan region RB3, is ablated using the first particle beam. This process is observed using the second particle beam, wherein, in this case too, reference is made to the text above.

As shown in FIG. 5, the scan region RB3 is now arranged in such a way that the scan region RB3 is aligned parallel to the target region ZB. The target region ZB is exposed by continuation of the scan region RB3 and further ablation of material from the sample 16.

The above-described exposure is now carried out from all sides adjacent to the target region ZB in such a way that the TEM lamella, which now contains the target region ZB, is exposed and can be separated from the sample 16.

In the aforementioned exemplary embodiment, provision is additionally made for the speed at which the first particle beam is moved over the scan regions RB1, RB2 and RB3 to be selected in a suitable manner. By way of example, the dwell time of the first particle beam at each scanning point P of the scan regions RB1, RB2 and RB3 lies in a range from 1 microsecond to 5 seconds. The dwell time is also referred to as pixel life and determines the speed at which the first particle beam is moved over the scan regions RB1, RB2 and RB3. However, the system described herein is not restricted to the aforementioned range of the dwell time. Rather, any suitable range is usable. Additionally or alternatively, provision is made in the described exemplary embodiments for the first particle beam to be guided a number of times over each scan line RZ1 to RZ4 in the arrow direction B, a number of times over each scan line RZ5 to RZ10 in the arrow direction B' and/or a number of times over each scan line RZ11 to RZ15 in the arrow direction B" in order to obtain particularly good ablation of material from the sample 16.

Figure 6:
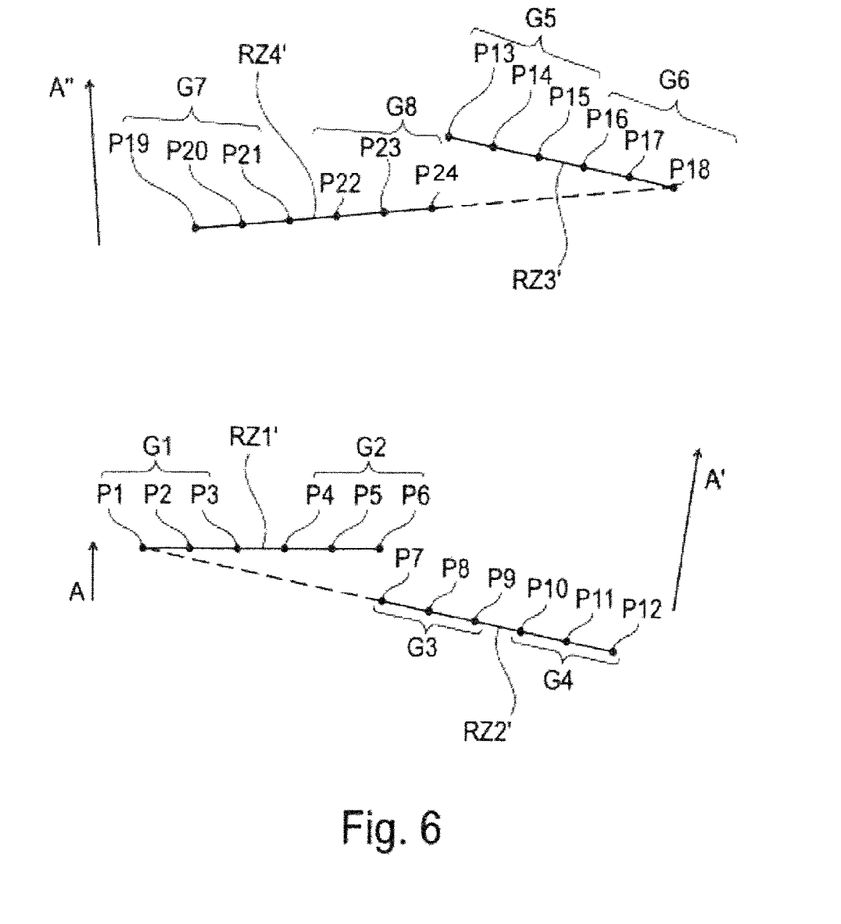
FIG. 6 shows a schematic illustration for explaining a further exemplary embodiment of the method according to the system described herein.

FIG. 6 shows a further embodiment of the method according to the system described herein. A scan region with a multiplicity of scan lines is set on the surface of the sample 16 for the purposes of exposing a TEM lamella in which a target region is situated (not depicted in FIG. 6). For reasons of clarity, only one of these scan lines, namely the first scan line RZ1', of this set scan region is depicted. The control unit 47 transmits control signals to the scanning electrodes 32 of the first particle beam column 2 in respect of how the first particle beam should pass through the set scan region. To this end, coordinates of scanning points of the individual scan lines are communicated to the control unit 47 from the processor 48. The control unit 47 then transmits control signals to the scanning electrodes 32 in such a way that the first particle beam is guided to the coordinates of the scanning points. However, in this embodiment, the processor 48 supplies the control unit 47 with input signals comprising coordinates of the scanning points in groups. Expressed differently, the processor 48 supplies the control unit 47 with, inter alia, the coordinates of the scanning points in subsets. The first particle beam is initially guided to the scanning points of one respective group before the first particle beam is guided to scanning points of a further group. By way of example, in the exemplary embodiment depicted in FIG. 6, provision is made for the first scan line RZ1' of the set scan region to comprise scanning points P1 to P6, wherein the scanning points P1 to P3 form a first group G1 and wherein the scanning points P4 to P6 form a second group G2. The first particle beam is initially guided to the scanning points P1 to P3 of the first group G1. Subsequently, the first particle beam is guided to the scanning points P4 to P6 of the second group G2.

After passing through the scanning points of one group, there is a query in the exemplary embodiment explained here as to whether a control command for changing the first scanning direction A was supplied to the control unit 47. In the exemplary embodiment depicted in FIG. 6, this occurred after passing through the second group G2. After determining the presence of the control command, the point of rotation is set in the scan line in which the first particle beam is situated at the time of the control command. This is the first scan line RZ1'. In the exemplary embodiment depicted here, provision is made for there to be a rotation in the clockwise direction. Furthermore, provision is made for the rotation always to occur in a direction directed away from the target region ZB. Accordingly, there is a rotation in the direction opposite to the first scanning direction A in the present case. In this exemplary embodiment, the scanning point P1 which is arranged at one end of the first scan line RZ1' is selected as point of rotation. Now, a first axis of rotation, about which the scan region is rotated in such a way that the scanning of the first particle beam is continued in a second scanning direction A', extends through the scanning point P1.

In the exemplary embodiment depicted in FIG. 6, a now newly aligned second scan line RZ2' does not cross the original first scan line RZ1' after the rotation of the scan region. Expressed differently, the two scan lines RZ1' and RZ2' do not touch each other, or only touch at one point.

Also in the embodiment in FIG. 6, scanning points on the second scan line RZ2' which correspond to the scanning points of the first scan line RZ1' due to the carried out rotation—i.e. those points on the second scan line RZ2' on which the scanning points of the first scan line RZ1' are imaged due to the carried out rotation—are situated further away from the target region ZB than the scanning points on the first scan line RZ1' itself.

The second scan line RZ2' now comprises scanning points P7 to P12, wherein the scanning points P7 to P9 form a third group G3 and wherein the scanning points P10 to P12 form a fourth group G4. The first particle beam is initially guided to the scanning points P7 to P9 of the third group G3. Subsequently, the first particle beam is guided to the scanning points P10 to P12 of the fourth group G4. Here too, after passing through the scanning points of each group, there is a query as to whether a control command for changing the second scanning direction A' was supplied to the control unit 47.

In the exemplary embodiment depicted in FIG. 6, there is no control command for changing the direction after passing through the fourth group G4. Accordingly, the scanning by the first particle beam is continued in the second scanning direction A'. The first particle beam is guided in the second scanning direction A' to further scan lines (not depicted here), which extend parallel to the second scan line RZ2' and the scanning points of which are offset parallel to the scanning points P7 to P12 of the second scan line RZ2'. After a certain amount of time, the first particle beam then reaches a third scan line RZ3'. The third scan line RZ3' comprises the scanning points P13 to P18, wherein the scanning points P13 to P15 form a fifth group G5 and wherein the scanning points P16 to P18 form a sixth group G6. The first particle beam is initially guided to the scanning points P13 to P15 of the fifth group G5. Subsequently, the first particle beam is guided to the scanning points P16 to P18 of the sixth group G6. Here too, after passing through the scanning points of each group, there is a query as to whether a control command for changing the second scanning direction A' was supplied to the control unit 47.

This occurred after passing through the sixth group G6. Now, once again, a point of rotation is set in the scan line in which the first particle beam is situated at the time of the control command. This is the third scan line RZ3'. In the exemplary embodiment depicted here, provision is made for there to be a counterclockwise rotation. Furthermore, provision is made for the rotation always to occur in a direction directed away from the target region ZB. Thus, there is a rotation in the direction opposite to the second scanning direction A' in the present case. In this exemplary embodiment, the scanning point P18 which is arranged at one end of the third scan line RZ3' is selected as point of rotation. Now, a second axis of rotation, about which the scan region is rotated in such a way that the first particle beam continues to be scanned in a third scanning direction A", extends through the scanning point P18.

In the exemplary embodiment depicted in FIG. 6, provision is made that a newly aligned fourth scan line RZ4' does not cross the original third scan line RZ3' after the rotation of the scan region. Expressed differently, the scan lines RZ3' and RZ4' do not touch each other, or only touch at one point.

The scanning by the first particle beam is now continued in the third scanning direction A". The first particle beam passes through the scan lines arranged in the third scanning direction A", of which only the fourth scan line RZ4' is depicted in FIG. 6. The fourth scan line RZ4' comprises scanning points P19 to P24, wherein the scanning points P19 to P21 form a seventh group G7 and wherein the scanning points P22 to P24 form an eighth group G8. The first particle beam is initially guided to the scanning points P19 to P21 of the seventh group G7. Subsequently, the first particle beam is guided to the scanning points P22 to P24 of the eighth group G8.

The first particle beam is guided in the third scanning direction A" to further scan lines (not depicted here), which extend parallel to the fourth scan line RZ4' and the scanning points of which are offset parallel to the scanning points P19 to P24 of the fourth scan line RZ4'. Then, in this exemplary embodiment, the first particle beam is guided in the third scanning direction A" until the target region ZB is reached.

It is understood that, even in the embodiment in FIG. 6, each scan line may comprise further scanning points not depicted in FIG. 6. By way of example, the scan line approached after the second scan line RZ2' and not depicted here may comprise a number of scanning points corresponding to the sum of the number of scanning points in the groups G1, G2, G3 and G4. Likewise, a scan line approached after the fourth scan line RZ4' and not depicted here may comprise a number of scanning points corresponding to the sum of the number of scanning points in the groups G5, G6, G7 and G8. However, alternatively, the number of scanning points in the individual scan lines may also differ.

The exemplary embodiments of the system described herein described here have the advantages already specified above, to which reference is made here in an explicit manner.

The above-described changes in the scanning directions can be achieved by virtue of the deflection voltages being applied to the scanning electrodes 32 in such a way that both the respectively desired direction of the scan lines and the respectively desired scanning direction are obtained. In the case of digital actuation, this can, for example, be brought about by virtue of the coordinates of the scanning points lying on the respectively desired and set scan line being initially calculated using a mathematical model and subsequently by virtue of the control voltages for the scanning electrodes being set by the scan generator in such a way that the first particle beam is directed to the scanning points calculated thus. However, such a procedure supposes that the functional relationship between the coordinates of the scanning points and the control voltages, which are to be applied to the scanning electrodes such that the first particle beam is directed to the calculated scanning points, is known. Alternatively, it is possible to calculate new control voltages, respectively from the scanning point set at the change-of-direction time and the control voltages applied to the scanning electrodes at this time, or to supply the scan generator with input signals corresponding to the new control voltages, which input signals bring about a deflection of the first particle beam in the respectively set direction of the scan line over the likewise set distance between the scanning points or over the set distance between the scan lines. In this case, all that needs to be known is what change in the deflection of the first particle beam causes a corresponding change in the deflection voltage or a corresponding change in the input signal.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SD card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method for processing and/or observing an object using at least one particle beam, in which the at least one particle beam is scanned over the object, the method comprising:

determining a scan region on the object, the scan region having a multiplicity of scan lines;

moving the particle beam within the scan region in a first scanning direction along one of the multiplicity of scan lines; and changing the first scanning direction into a second scanning direction at a change-of-direction time, wherein changing the first scanning direction into the second scanning direction comprises a setting of a point of rotation in the scan line of the scan region in which the at least one particle beam is situated at the change-of-direction time while scanning the particle beam within the scan region, with an axis of rotation extending through the point of rotation, and wherein the first scanning direction is changed into the second scanning direction by rotating the scan region about the axis of rotation, with the point of rotation being selected dependent on the direction of rotation that is selected such that scanning points of the scan lines in the scan region are further away from a target region of the object after the rotation of the scan region than scanning points of the scan line which were scanned by the particle beam before rotation of the scan region.

2. The method according to claim 1, wherein the point of rotation is set in such a way that the axis of rotation is oriented perpendicular to a surface of the object.

3. The method according to claim 1, wherein each scan line of the multiplicity of scan lines respectively comprises a first scan line end and respectively comprises a second scan line end, and wherein the first scan line end or the second scan line end of the scan line at which the at least one particle beam is situated at the change-of-direction time is set as the point of rotation.

4. The method according to claim 3, wherein the first scan line end is set as the point of rotation in the case of a clockwise rotation, and wherein the second scan line end is set as the point of rotation in the case of a counterclockwise rotation.

5. The method according to claim 1, wherein the at least one particle beam is moved in such a way that the at least one particle beam does not cross that scan line in which the at least one particle beam is situated at the change-of-direction time after the rotation of the scan region from the first scanning direction to the second scanning direction.

6. The method according to claim 1, further comprising:
    setting a speed at which the at least one particle beam is moved over the scan region.

7. The method according to claim 1, further comprising:
    setting how often the at least one particle beam is moved along one of the scan lines.

8. The method according to claim 1, wherein the at least one particle beam is embodied as a first particle beam, by which the scan region is processed, and wherein the object is observed using a second particle beam.

9. The method according to claim 8, wherein an ion beam is used as the first particle beam and an electron beam is used as the second particle beam.

10. The method according to claim 8, wherein an ion beam is used as the first particle beam and an ion beam is used as the second particle beam.

11. A non-transitory computer-readable medium storing software that, when executed, controls a particle beam device, the software comprising:

executable code that determines a scan region on an object, the scan region having a multiplicity of scan lines;

executable code that moves the particle beam within the scan region in a first scanning direction along one of the multiplicity of scan lines; and executable code that changes the first scanning direction into a second scanning direction at a change-of-direction time, wherein the executable code that changes the first scanning direction into the second scanning direction includes executable code that sets a point of rotation in the scan line of the scan region in which the at least one particle beam is situated at the change-of-direction time while scanning the particle beam within the scan region, with an axis of rotation extending through the point of rotation, and wherein the first scanning direction is changed into the second scanning direction by rotating the scan region about the axis of rotation, with the point of rotation being selected dependent on the direction of rotation that is selected such that scanning points of the scan lines in the scan region are further away from a target region of the object after the rotation of the scan region than scanning points of the scan line which were scanned by the particle beam before rotation of the scan region.

12. The non-transitory computer-readable medium according to claim 11, wherein the point of rotation is set in such a way that the axis of rotation is oriented perpendicular to a surface of the object.

13. The non-transitory computer-readable medium according to claim 11, wherein each scan line of the multiplicity of scan lines respectively comprises a first scan line end and respectively comprises a second scan line end, and wherein the first scan line end or the second scan line end of the scan line, at which the at least one particle beam is situated at the change-of-direction time, is set as the point of rotation.

14. The non-transitory computer-readable medium according to claim 13, wherein the first scan line end is set as the point of rotation in the case of a clockwise rotation, and wherein the second scan line end is set as the point of rotation in the case of a counterclockwise rotation.

15. The non-transitory computer-readable medium according to claim 11, wherein the at least one particle beam is moved in such a way that the at least one particle beam does not cross that scan line in which the at least one particle beam is situated at the change-of-direction time after the rotation of the scan region from the first scanning direction to the second scanning direction.

16. The non-transitory computer-readable medium according to claim 11, wherein the software further comprises at least one of:
  (i) executable code that sets a speed at which the at least one particle beam is moved over the scan region, or
  (ii) executable code that sets how often the at least one particle beam is moved along one of the scan lines.

17. The non-transitory computer-readable medium according to claim 11, wherein the at least one particle beam is embodied as a first particle beam, by which the scan region is processed, and wherein the object is observed using a second particle beam.

18. The non-transitory computer-readable medium according to claim 17, wherein one of the following is provided:
  (i) an ion beam is used as the first particle beam and an electron beam is used as the second particle beam, or
  (ii) an ion beam is used as the first particle beam and an ion beam is used as the second particle beam.

19. A particle beam device, comprising:
  at least one beam generator for generating a particle beam;
  at least one objective lens for focusing the particle beam onto an object; and
  at least one control unit comprising at least one processor executing software stored on a non-transitory computer-readable medium, the software comprising:
    executable code that determines a scan region on the object, the scan region having a multiplicity of scan lines;
    executable code that moves the particle beam within the scan region in a first scanning direction along one of the multiplicity of scan lines; and
    executable code that changes the first scanning direction into a second scanning direction at a change-of-direction time,
    wherein the executable code that changes the first scanning direction into the second scanning direction includes executable code that sets a point of rotation in the scan line of the scan region in which the at least one particle beam is situated at the change-of-direction time while scanning the particle beam within the scan region, with an axis of rotation extending through the point of rotation, and
  wherein the first scanning direction is changed into the second scanning direction by rotating the scan region about the axis of rotation, with the point of rotation being selected dependent on the direction of rotation that is selected such that scanning points of the scan lines in the scan region are further away from a target region of the object after the rotation of the scan region than scanning points of the scan line which were scanned by the particle beam before rotation of the scan region.

20. The particle beam device according to claim 19, wherein the point of rotation is set in such a way that the axis of rotation is oriented perpendicular to a surface of the object.

21. The particle beam device according to claim 19, wherein each scan line of the multiplicity of scan lines respectively comprises a first scan line end and respectively comprises a second scan line end, and wherein the first scan line end or the second scan line end of the scan line, at which the at least one particle beam is situated at the change-of-direction time, is set as the point of rotation.

22. The particle beam device according to claim 21, wherein the first scan line end is set as the point of rotation in the case of a clockwise rotation, and wherein the second scan line end is set as the point of rotation in the case of a counterclockwise rotation.

23. The particle beam device according to claim 19, wherein the at least one particle beam is moved in such a way that the at least one particle beam does not cross that scan line in which the at least one particle beam is situated at the change-of-direction time after the rotation of the scan region from the first scanning direction to the second scanning direction.

24. The particle beam device according to claim 19, wherein the software further comprises at least one of:
  (i) executable code that sets a speed at which the at least one particle beam is moved over the scan region, or
  (ii) executable code that sets how often the at least one particle beam is moved along one of the scan lines.

25. The particle beam device according to claim 19, wherein the at least one particle beam is embodied as a first particle beam, by which the scan region is processed, and wherein the object is observed using a second particle beam.

26. The particle beam device according to claim 25, wherein one of the following is provided:
  (i) an ion beam is used as the first particle beam and an electron beam is used as the second particle beam, or
  (ii) an ion beam is used as the first particle beam and an ion beam is used as the second particle beam.

* * * * *